United States Patent [19]

Wada

[11] Patent Number: 5,262,985
[45] Date of Patent: Nov. 16, 1993

[54] NONVOLATILE SEMICONDUCTOR MEMORY DEVICE

[75] Inventor: Masashi Wada, Yokohama, Japan

[73] Assignee: Kabushiki Kaisha Toshiba, Japan

[21] Appl. No.: 659,183

[22] Filed: Feb. 22, 1991

[30] Foreign Application Priority Data

Feb. 23, 1990 [JP] Japan .................................. 2-40911

[51] Int. Cl.$^5$ ...................... G11C 7/00; G11C 16/00; G11C 16/06
[52] U.S. Cl. ...................................... 365/185; 365/218
[58] Field of Search .................. 365/185, 218, 189.01, 365/104

[56] References Cited

U.S. PATENT DOCUMENTS

| | | | |
|---|---|---|---|
| 4,979,146 | 12/1990 | Yokoyama | 365/218 X |
| 5,126,808 | 6/1992 | Montalvo et al. | 365/185 X |
| 5,132,935 | 7/1992 | Ashmore, Jr. | 365/218 |
| 5,138,576 | 8/1992 | Madurawe | 365/185 |

OTHER PUBLICATIONS

"A Single Transistor EEPROM Cell And Its Implementation In A 512K CMOS EEPROM." Satyen Mukherjee et al., Technical Digest of 1985 IEDM, pp. 616-619.

"A 128K Flash EEPROM Using Double Polysilicon Technology." Georghe Samachisa et al., Technical Digest of 1987 ISSCC, pp. 76-77.

"A New Hand Cell For Ultra High Density 5V-Only EEPROMs." R. Shirota et al., Technical Digest of 1988 VLSI Symposium, pp. 33-34.

"A New Flash-Erase EEPROM Cell With A Sidewall Select-Gate On Its Source Side." K. Naruke et al., Technical Digest of 1989 IEDM, pp. 603-606.

Primary Examiner—Alyssa H. Bowler
Attorney, Agent, or Firm—Banner, Birch, McKie & Beckett

[57] ABSTRACT

A nonvolatile semiconductor memory device according to the present invention comprises a memory cell array composed of a collection of blocks, each block containing memory cells sharing the source or drain, a first region having the memory cell array formed in its surface region, and a control circuit that, in the erase mode, sets the source shared by a plurality of memory cells to be erased in one block at a first potential and the first region at a second potential higher than the GND potential and lower than the first potential, and at the same time, sets the source shared by a plurality of memory cells not to be erased in other blocks at a third potential equal to or higher than the second potential and lower than the first potential.

20 Claims, 14 Drawing Sheets

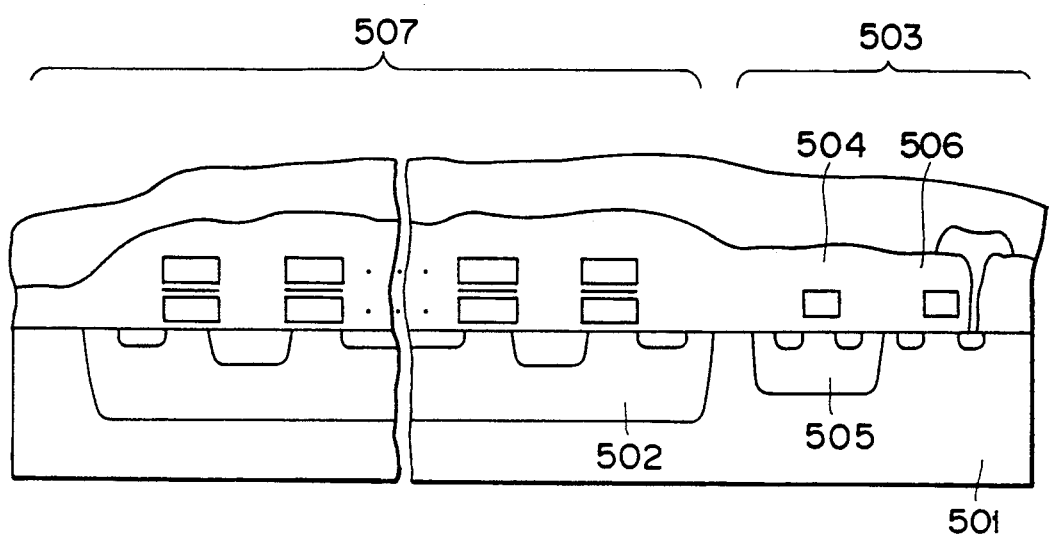
F I G. 7
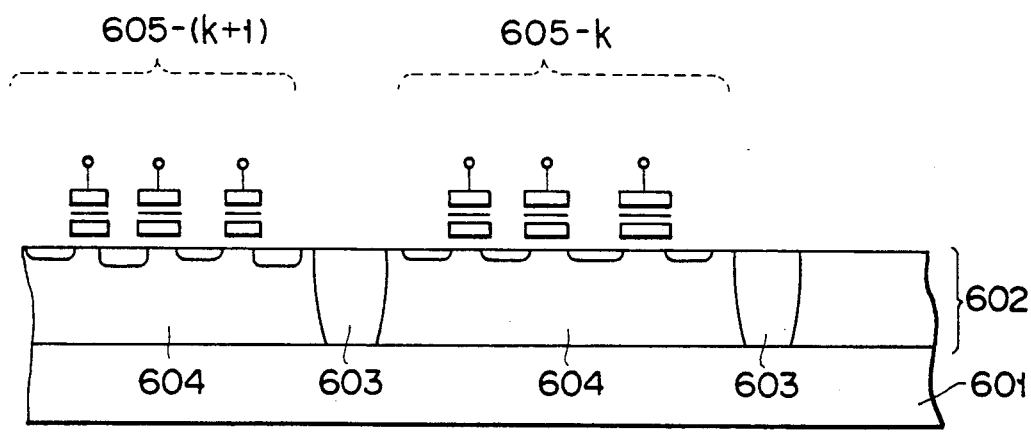
F I G. 8

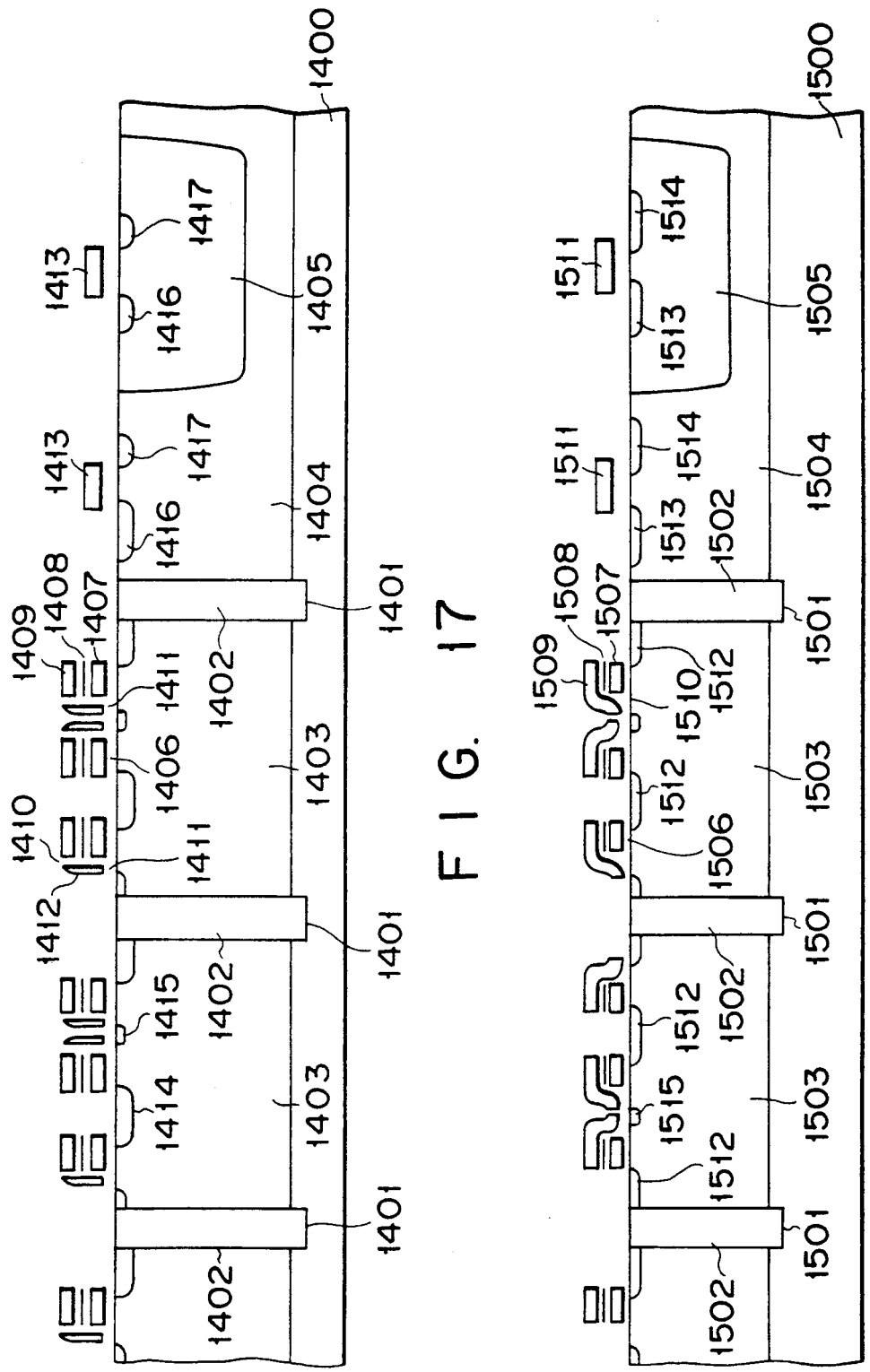

NONVOLATILE SEMICONDUCTOR MEMORY DEVICE

BACKGROUND OF THE INVENTION

1. Field of the Invention

This invention relates to nonvolatile semiconductor memory devices, and more particularly to a flash-type nonvolatile semiconductor memory device that operates with a 5-V power supply only.

2. Description of the Related Art

Recent developments in semiconductor technology allow new products of the fields except the semiconductor fields and help lighten and miniaturize conventional products remarkably, giving extensive changes to our daily life. Above all, semiconductor memory technology, which is closely related to modern society, has been making remarkable advances. Semiconductor memories are broadly classified into volatile memories such as DRAMs whose stored data is lost when power is off and nonvolatile memories whose retained data is not lost even when power ceases.

Nonvolatile memories, widely used as read-only memories, are characterized by retaining the information even when the power ceases. They can be divided into mask ROMs (Read-Only Memories) into which information is written during the manufacture of the elements, PROMs (Programmable ROMs) into which users themselves can write data, UV-EPROMs (Ultraviolet Erasable Programmable ROMs) that allow the information to be erased by ultraviolet radiation, and rewritten into them and EEPROMs (Electrically Erasable Programmable ROMs) that enable electrical erasure of data. Although EEPROMs are the most user-friendly ROMs, they have many technical problems to overcome, such as difficulties in very high integration. Presently, this limits applications of EEPROMs compared with other types of memories.

Today, flash-type semiconductor memories designed for very high integration have been attracting attention and encouraging heated development in many companies of the world. For example, in the 1989 ISSCC (International Solid State Circuit Conference), two U.S. companies Intel and Seeq announced 1M-bit flash memories and already put them on the market.

As shown in FIG. 1, memory cells constituting conventional flash-type semiconductor memories are MOS field-effect transistors with a two-layer gate structure of a floating gate 102 and a control gate 103 both formed above a semiconductor substrate 101. The writing of information can be electrically achieved by injecting hot carriers generated in the vicinity of a drain 104 into the floating gate 102. Hot carriers can be generated by applying a high voltage to the drain 104 and control gate 103 and connecting a source 105 to the ground to accelerate the electrons flowing through the channel by a high electric field generated near the drain 104. To erase the information, a high voltage is applied to the source 105 and the control gate is connected to the ground, so that a high electric field is applied to the thin silicon oxide film 106 between the source 105 and floating gate 102, thereby allowing a tunnel current to flow through the silicon oxide film 106. The memory cell of FIG. 1 is characterized by its very simple structure and the suitability for miniaturization because of the self-aligning formation of each of the floating gate 102, control gate 103, drain 104, and source 105.

With the structure of FIG. 1, however, applying a high voltage to the source 105 for erasure causes a phenomenon known as band-to-band tunneling to take place at the surface of the source 105 below the floating gate 102. As a result of this, in the depletion layer of the source 105, carriers are generated and accelerated by a high electric field. The accelerated carriers cause ionizing collisions, which in turn generate still more carriers, resulting in a very large current flow between the source 105 and substrate 101. That is, the substrate current is considerably large compared with the tunnel current flowing through the silicon oxide film 106. Thus, the supply of erasure high voltage $V_{pp}$ (e.g., 12.5 V) from a high voltage generator circuit formed on the chip requires the circuit to have a large power capacity, making the chip size very large. On the other hand, externally supplying the erasure high voltage $V_{PP}$ goes against the concept of operating a flash-type EEPROM with a single power supply (5 V).

To avoid the above problems, a method has been proposed in which a cell region is formed in a p-well 202 formed in a n-type semiconductor substrate 201 as shown in FIG. 2. With this arrangement, the erasing of information is performed by applying a high voltage $V_{PP}$ to the n-type silicon substrate 201, p-well 202, source 203, and drain 204, connecting the control gate 205 to the ground, and allowing a tunnel current to flow through the thin gate oxide film 206. In this case, no high voltage applied across the source 203 and p-well 202 results in a decrease in the substrate current caused by the aforementioned band-to-band tunneling, allowing the flash-type EEPROM to operate with a single power supply.

For EEPROMs composed of memory cells having the structure shown in FIG. 2, however, rewriting data in blocks instead of overall erasure requires providing one well for each block. This makes it necessary to have isolating regions between wells, which increases the chip size substantially when the number of block divisions is extremely large, making them unsuitable for practical uses.

SUMMARY OF THE INVENTION

To overcome the problems mentioned above, it is an object of the present invention to provide a nonvolatile semiconductor memory device that suppresses the generation of substrate current due to band-to-band tunneling and allows operation from a signal power supply.

It is another object of the present invention to provide a nonvolatile semiconductor memory device that allows erasure of information in blocks. It is still another object of the present invention to provide a nonvolatile semiconductor memory device that minimizes the chip size even when the number of blocks is large.

To achieve the above objects, a nonvolatile semiconductor memory device according to the present invention comprises: a memory cell array including a collection of blocks each containing memory cells sharing the source or drain; a first region having the memory cell array formed in its surface region; and a control circuit that, in the erase mode, sets the source or drain shared by a plurality of memory cells to be erased in one block at a first electric potential and the first region at a second electric potential higher than the GND electric potential and lower than the first electric potential, and at the same time, sets the source or drain shared by a plurality of memory cells not to be erased in other blocks at a third electric potential equal to or higher than the second electric potential and lower than the first electric potential.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 7 through 12 are sectional views for nonvolatile semiconductor memory devices as still other embodiments of the present invention;

FIGS. 16 through 20 are sectional views for nonvolatile semiconductor memory devices as still further embodiments of the present invention.

DETAILED DESCRIPTION OF THE PREFERRED EMBODIMENTS

Embodiments of the present invention will be explained in detail, referring to the accompanying drawings.

Figure 1:
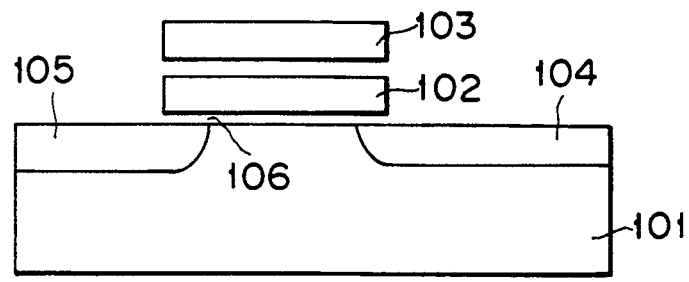
FIGS. 1 and 2 are sectional views of conventional nonvolatile semiconductor memory devices.
Figure 2:
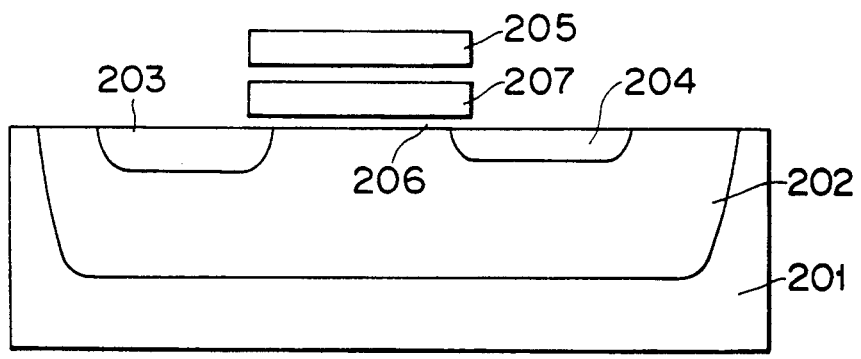
Figure 3:
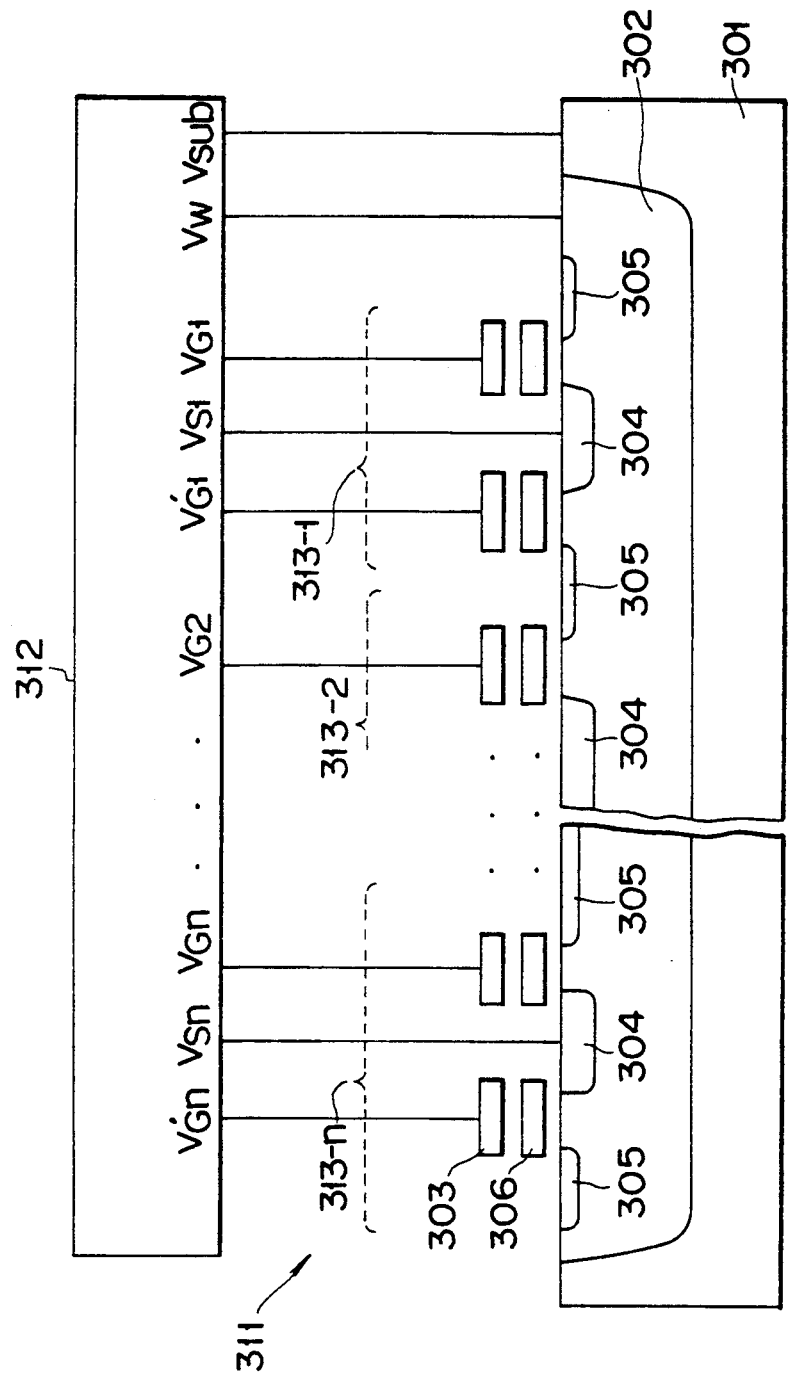
FIG. 3 is a sectional view showing the structure of a nonvolatile semiconductor memory device as an embodiment of the present invention.

FIG. 3 shows a basic structure of a nonvolatile semiconductor memory device as an embodiment of the present invention.

In an n-type silicon substrate 301, a p-type well 302 is formed. In the p-type well 302, a plurality of memory cells are arranged in matrix, each memory cell including a control gate 303, source 304, drain 305, and floating gate 306. The memory cells, which all constitute a memory cell array, are divided into two or more functional blocks. For example, the entire memory cell array is divided into n blocks $313_{-1}$ through $313_{-n}$, provided that two rows of memory cells sharing the source 304 are grouped into one block.

To erase the stored information in blocks from the individual memory cells, a control circuit 312 controls the application of electric potential to the n-type silicon substrate 301, p-type well 302, control gate 303, and source 304 in the way as described below.

Both the electric potential $V_{sub}$ of the silicon substrate 301 and the potential $V_W$ of the p-well 302 are set at, for example, an external power supply potential $V_{CC}$ (e.g., 5 V), and the potential $V_{G1-Gn}$ of control gates 303 for all memory cells is set at, for example, the ground potential $V_{SS}$. The potential $V_{S1-Sn}$ of the source 304 for the block containing memory cells to be erased is set at a high voltage $V_{PP}$ (e.g., 12.5 V) $> V_{CC}$. This high voltage $V_{PP}$ is produced by a high voltage generator circuit 314 in FIG. 4 formed on the substrate 301 which increases the external potential $V_{CC}$. Therefore, the chip operates only on a 5 V power supply potential $V_{CC}$ when viewed with the outside. In addition, only a voltage of $V_{PP}-V_{CC}=7.5$ V is applied across the source 304 and p-type well 302, so that a substrate current due to band-to-band tunneling is reduced in comparison with the direct application of $V_{PP}$ in the prior art. The potential $V_{S1-Sn}$ of the source 304 for blocks including memory cells not, to be erased is set at a potential in the range of $V_W < V_{Sz-Sn} < V_{PP}$, for example, at the external power supply potential $V_{CC}$. Although the external power supply potential $V_{CC}$ is also applied to the source 304 of the memory cells not to be erased, it is too low to erase the stored information, preventing erroneous operations.

In the write mode, the potential $V_{sub}$ of the silicon substrate 301 and the potential $V_W$ of the p-type well 302 are set at, for example, the ground potential $V_{SS}$. The potential $V_D$ of the drain 305 of the memory cell into which information is written and the potential $V_{G1-G2}$ of the control gate 303 is set at a high potential $V_{PP}$. This causes hot carriers generated near the drain 305 to be injected into the floating gate 306 to write the information.

Figure 4:
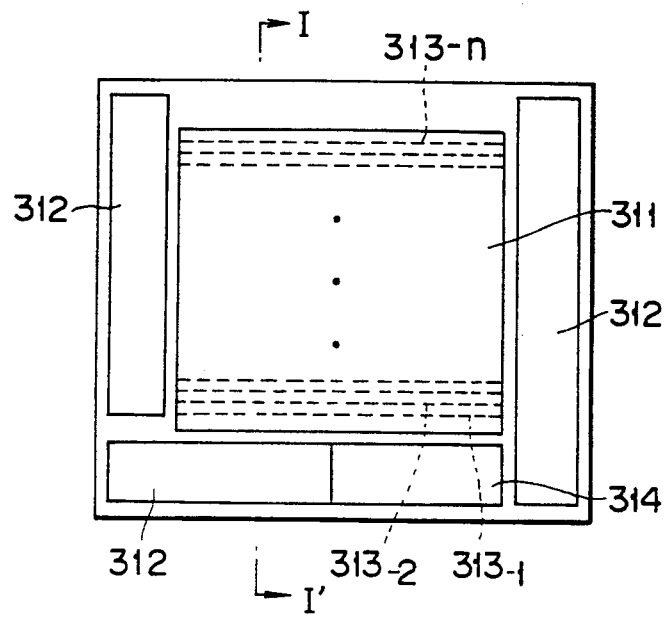
FIG. 4 view of 16M-bit nonvolatile memory device as another embodiment of the present invention.
Figure 5:
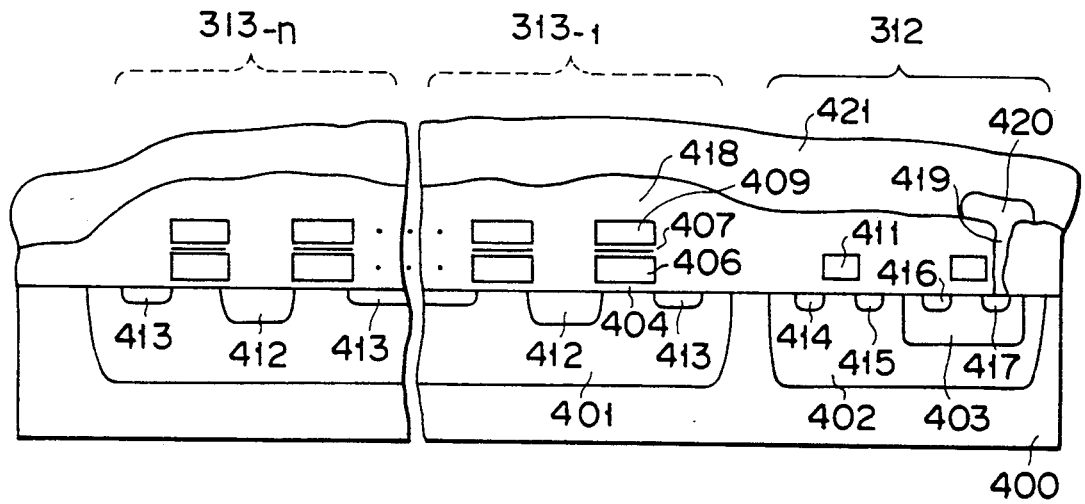
FIG. 5 is a sectional view taken along line I—I' in FIG. 4.

FIGS. 4 and 5 illustrate a nonvolatile semiconductor memory device having a memory capacity of, for example, 16M bits as another embodiment of the present invention. FIG. 4 is a schematic plan view for an entire nonvolatile memory device chip and FIG. 5 is a sectional view taken on line I—I' in FIG. 4. Numeral 311 indicates a memory cell array, 312 a control circuit, $313_{-1}$ through $313_{-n}$ blocks, and 314 a high voltage generator circuit.

In an n-type silicon substrate 400, a p-type well 401 is formed. In the surface region of the p-type well 401, a plurality of memory cells are formed, each of which is made up of a floating gate 406, source 412, drain 413, and control gate 409. They constitute a memory cell array 311. The memory cell array 311 is divided into functional blocks $313_{-1}$ through $313_{-n}$. A plurality of p-type wells 401 are formed and each p-type well may contain two or more blocks $313_{-1}$ through $313_{-n}$. Each of blocks $313_{-1}$ through $313_{-n}$ may be provided with one p-type well 401. Around the n-type silicon substrate 400, the control circuit 312 and high voltage generator circuit 314 are formed. The control circuit 312 and high voltage generator circuit 314 are composed of transistors mainly constituted by a gate 411, sources 414 and 416, and drains 415 and 417. The potential of the p-type well 402 in the control circuit 312 remains at the control voltage $V_{SS}$ even in any of write, erase, and read modes, assuring stable operation of the control circuit 312.

In the 16M-bit nonvolatile memory device, the memory cell array 311 consists of 4096×4096 memory cells. For example, if two rows of memory cells (8192 bits) sharing the source are grouped into one block, then all memory cells can be divided into 2048 blocks $313_{-1}$ through $313_{-2048}$.

With this configuration, in erasing the information from the memory cell, the control circuit 312 operates so that a high voltage may not be applied across the p-type well 401 and the source of the memory cell to be erased. This reduces the substrate current caused by band-to-band tunneling, allowing operation of memory with the 5 V external power supply potential only. Division of the memory cell array 311 into blocks $313_{-1}$ through $313_{-n}$ enables erasure of information in blocks. Furthermore, the formation of multiple memory-cell blocks $313_{-1}$ through $313_{-n}$ in the p-type well 401 minimizes the chip size.

Figure 6A:
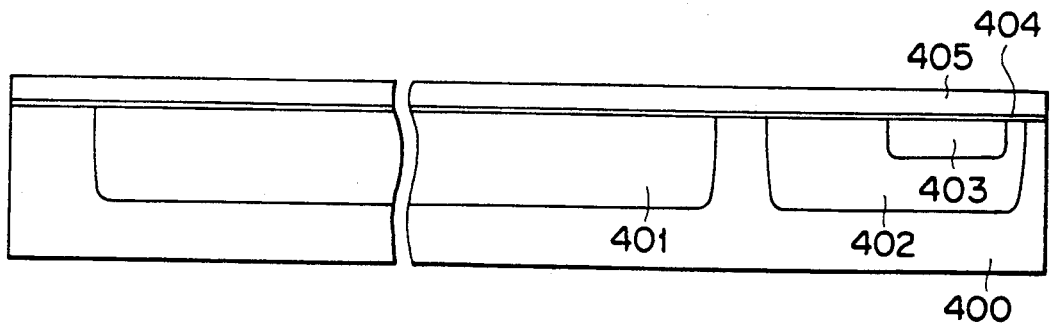
FIGS. 6A through 6C are sectional views illustrating the method of manufacturing the nonvolatile memory device of FIG. 5.
Figure 6B:
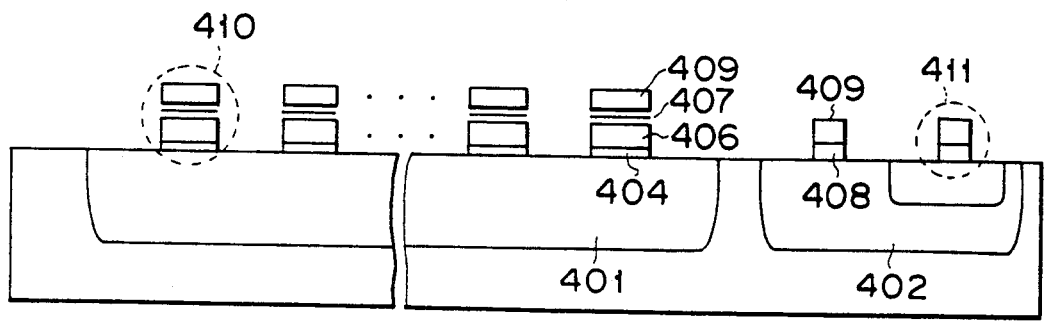
Figure 6C:
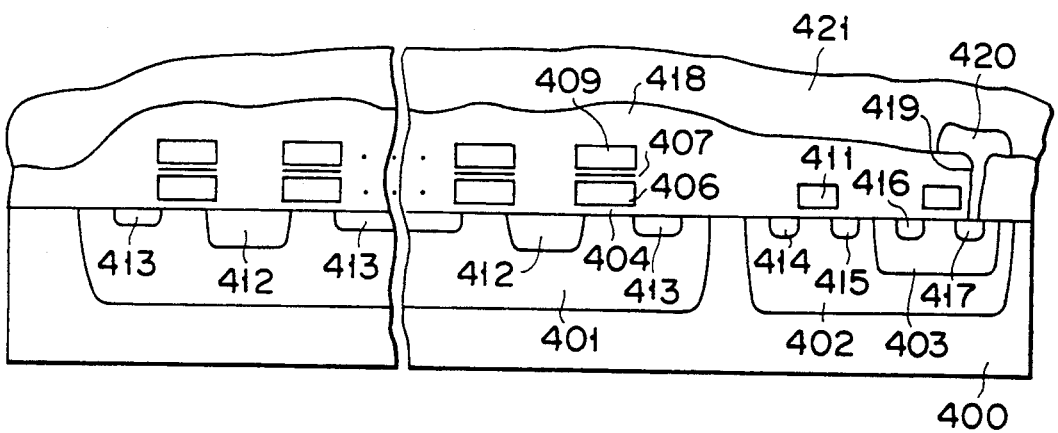

FIGS. 6A through 6C show the method of manufacturing the nonvolatile memory device of FIG. 5.

As shown in FIG. 6A, in an n-type silicon substrate 400, a p-type well 401 for the memory cell region and a p-type well 402 for the peripheral circuit region are formed. In the peripheral circuit region's p-type well 402, an n-type well 403 is formed. Over the entire surface of the substrate, a first silicon oxide film 404 is grown to a thickness of nearly 100 Å. After this, all over the resulting surface, a first polycrystalline silicon (polysilicon) layer 405 is deposited. As shown in FIG. 6B, patterning is performed on the first polysilicon layer 405 by a known photolithography technique to leave the first silicon oxide film 404 and first polysilicon layer 405 in the region where a floating gate 406 is to be made. Over the first polysilicon layer 405, a composite film 407 of silicon oxide and silicon nitride films is formed as an interlayer insulating film. After the composite film 407 formed in the peripheral circuit region is removed, a second silicon oxide film 408 is formed which is to be a gate insulating film for transistors in the peripheral circuit. Over the resulting surface, a second polysilicon layer 409 is deposited. After this, patterning is done on the memory cell section using a known photolithography to form a two-layer gate structure in a self-aligning manner. In the peripheral circuit, patterning of the second polysilicon 409 is achieved to form the gate 411 of a transistor. Then, an n+-type region, in which the source 412 and drain 413 of a memory cell is to formed, is formed by implanting, for example, arsenic (As) ions into the p-type well as shown in FIG. 6C. To increase the junction breakdown voltage of the source 412, phosphorus (P) ions are implanted into the source 412 only. In the peripheral circuit region, a source 414 and drain 415 of n-channel transistor are formed by ion implantation of arsenic. A source 416 and drain 417 of p-channel transistor are formed by ion-implantation of boron (B). After this, the oxidization, the deposition of a passivation film 418, the opening of contact holes 419, the formation of aluminum interconnections 420, and the deposition of passivating film 421 are accomplished to complete the fabrication of the semiconductor memory.

FIGS. 7 and 8 show modifications for the semiconductor memory device of FIG. 5.

In a semiconductor memory device of FIG. 7, p-type wells 502 and 505 are formed in an n-type silicon substrate 501. The p-type well 505 in the peripheral circuit region 503 is formed only on the side of the n-channel transistor 504. A p-channel transistor 506 is formed in the surface region of the n-type silicon substrate 501, not in the well region. In this modification, use of only single-type wells in the silicon substrate 501 makes the process simpler.

In a semiconductor memory device of FIG. 8, an epitaxial layer 602 is formed on a n-type silicon substrate 601. In the p-type epitaxial layer 602, n-type impurity layers 603 are formed which extend from the surface region of the epitaxial layer 602 to the substrate 601. The p-type epitaxial layer 602 is divided by the impurity layers 603 to form a plurality of p-type wells 604. In each p-type well 604, one or more memory cell blocks (e.g., blocks $605_{-k}$, $605_{-(k+1)}$) are formed. All memory cell blocks $605_{-k}$ through $605_{-(k+1)}$ may be formed in a single p-type well 604.

FIGS. 9 through 12 illustrate nonvolatile semiconductor memory devices as other embodiments of the present invention.

Figure 9:
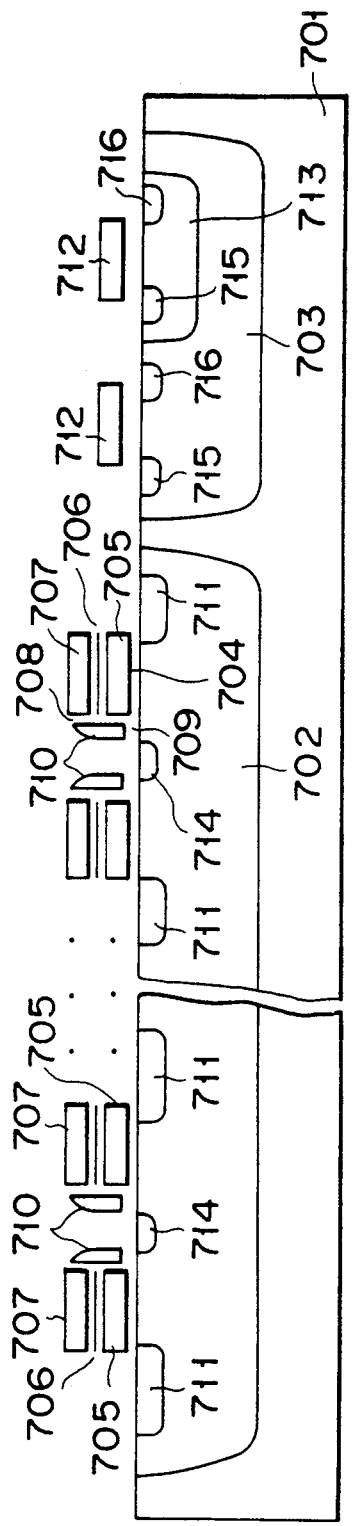

In a nonvolatile memory device of FIG. 9, a p-type well 702 for the memory cell region and a p-type well 703 for the peripheral circuit region are formed in an n-type silicon substrate 701. In the p-type well 702, a plurality of memory cells are formed. Each memory cell is composed of: a thin oxide film 704; a floating gate 705 formed on the oxide film 704; a composite film 706 of a silicon oxide film and silicon nitride film formed on the floating gate 705; a control gate 707 formed on the composite film 706; a silicon oxide film 708 formed on the side walls of the floating gate 705 and control gate 707; and a select gate 710 formed on silicon oxide film 709. In the figure, numeral 712 indicates a gate in the peripheral circuit region; 713 an n-type well formed in the p-type well 703 of the peripheral circuit region; 714 the source of a memory cell; and 715 and 716 are the drain or source of a transistor in the peripheral circuit region.

In this arrangement, to erase the information in blocks from the memory cells, the silicon substrate 701's potential $V_{sub}$, p-type well 702's potential $V_W$, control gate 707's potential $V_{G1-Gn}$, and drain 711's potential are controlled in a manner as described below.

The silicon substrate 701's potential $V_{sub}$ and p-type well 702's potential $V_W$ are set at, for example, the external power supply potential $V_{CC}$, while the potentials $V_{G1-Gn}$ of the control gates 303 and select gates 710 of all memory cells are set at, for example, the ground potential $V_{SS}$. The potential $V_D$ of the drain 711 for the block containing memory cells to be erased is set at a high voltage $V_{PP} > V_{CC}$. This high voltage $V_{PP}$ is obtained by raising the external power supply potential $V_{CC}$ with the high voltage generator circuit 314 formed on the substrate 301. This makes the chip operate only from the 5 V power supply potential $V_{CC}$ when viewed from the outside. Since a voltage $V_{PP} - V_{CC}$ is applied across the drain 711 and p-type well 702, a substrate current due to band-to-band tunneling is decreased compared with a conventional device where $V_{PP}$ is directly applied. The potential $V_D$ of the drains 711 of memory cells not to be erased is set at a value in the range of $V_W < V_D < V_{PP}$, for example, at the external power supply potential $V_{CC}$. Al though the external power supply potential $V_{CC}$ is applied to the drains 711 of the memory cells not to be erased, the magnitude of the potential is too low to erase the information, preventing erroneous operations.

To write the information, the silicon substrate 701's potential $V_{sub}$ and p-well 702's potential $V_W$ are set at the ground potential $V_{SS}$. In addition, the external power supply voltage $V_{CC}$ is applied to the drains 711 of memory cells into which the information is written; a voltage (up to 2 V) almost equal to the threshold value is applied to the select gate 710; and a high voltage $V_{PP}$ is applied to the control gate 707. Then, a write operation is completed by injecting hot electrons, generated in the vicinity of the substrate between the select gate 710 and floating gate electrode 705, into the floating gate electrode 705. The potential of the p-type well 703 in the peripheral circuit region is constantly kept at the ground potential $V_{SS}$.

Figure 10:
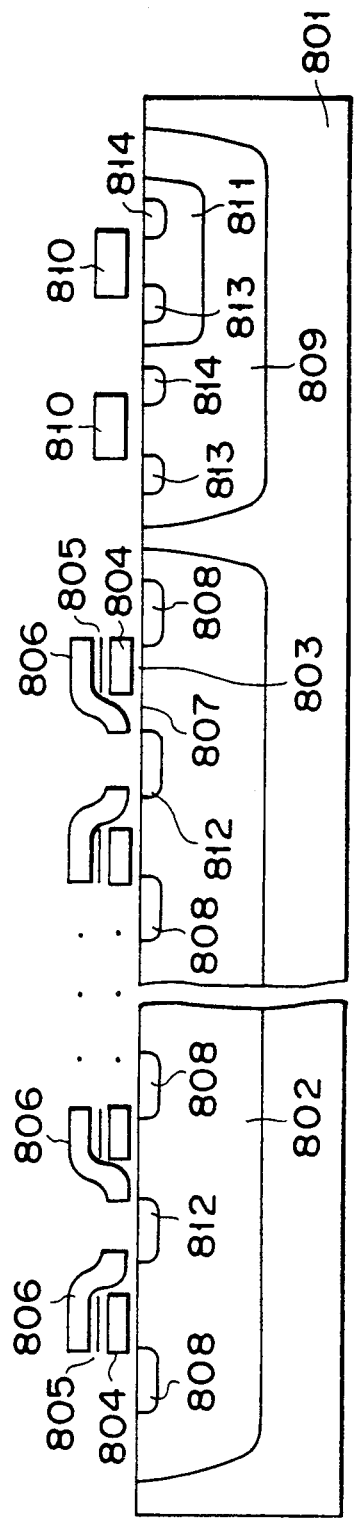

In a nonvolatile memory device of FIG. 10, a p-type well 802 for the memory cell region and a p-type well 809 for the peripheral circuit region are formed in an n-type silicon substrate 801. A memory cell formed in the p-type well 802 is made up of a thin oxide film 803, a floating gate 804 formed on the oxide film 803, a composite film 805 composed of a silicon oxide film and silicon nitride film formed on the floating gate 804, and a control gate 806 formed on the composite film 805. The control gate 806 is extended over a channel region 807 not covered with the floating gate electrode 804.

In FIG. 10, numeral 810 indicates a gate in the peripheral circuit region, 811 an n-type well formed in the p-type well in the peripheral circuit region, 808 the drain of a memory cell, 812 the source of the memory cell, and 813 and 814 the source or drain of a transistor in the peripheral circuit.

With this device, to erase the information in blocks from the memory cells, the silicon substrate 801's potential $V_{sub}$, p-type well 802's potential $V_W$, control gate 806's potentials $V_{G1-Gn}$, and drain 808's potential $V_D$ are controlled in the same way as with the embodiment of FIG. 9.

Figure 11:
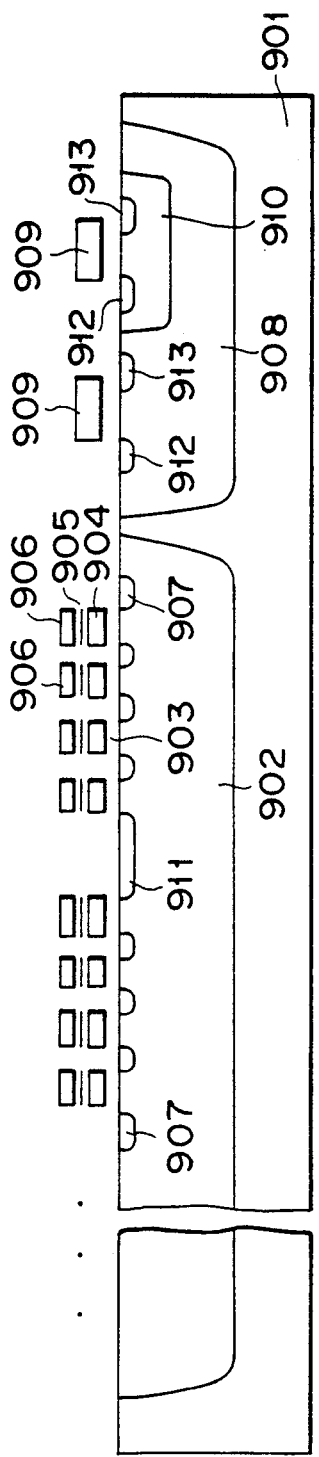

In a nonvolatile memory device of FIG. 11, a p-type well 902 for the memory cell region and a p-type well 908 for the peripheral circuit region are formed in an n-type silicon substrate 901. A memory cell formed in the p-type well 902 is made up of a thin oxide film 903, a floating gate 904 formed on the oxide film 903, a composite film 905 composed of a silicon oxide film and silicon nitride film formed on the floating gate 904, and a control gate 906 formed on the composite film 905. A plurality of memory cells with the same structure are connected in series to form an NAND cell arrangement.

In FIG. 11, numeral 909 indicates a gate in the peripheral circuit region, 910 an n-type well formed in the p-type well in the peripheral circuit region, 907 the source of the memory cell, 911 the drain of a memory cell, and 912 and 913 the source or drain of a transistor in the peripheral circuit.

With this device, to erase the information in blocks from the memory cells, the silicon substrate 901's potential $V_{sub}$, p-type well 902's potential $V_W$, control gate 906's potentials $V_{G1-Gn}$, and drain 911's potential $V_D$ are controlled in the same way as with the embodiment of FIG. 9.

Figure 12:
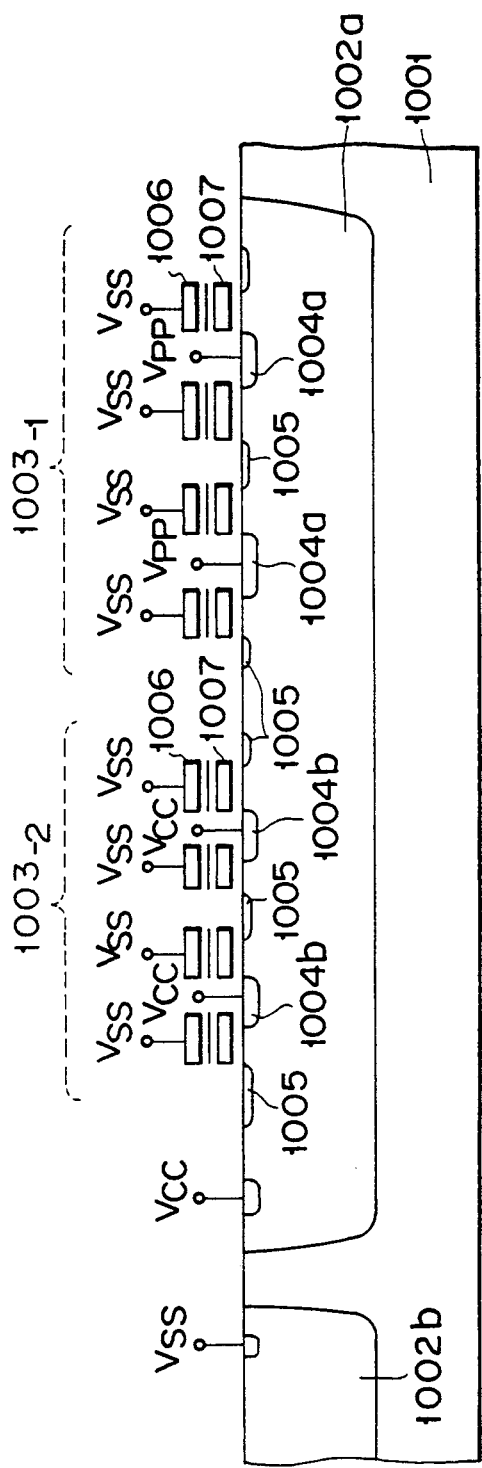

In a nonvolatile memory device of FIG. 12, a plurality of p-type wells $1002a$, $1002b$, ... for the memory cell region are formed in an n-type silicon substrate 1001. In each p-type well $1002a$, multiple memory-cell blocks $1003_{-1}$ and $1003_{-2}$ are formed.

With this device, to erase the information in blocks from the memory cells, the silicon substrate 1001's potential $V_{sub}$, p-type well 1002's potential $V_W$, control gate 1006's potentials $V_{G1-Gn}$, and sources $1004a$ and $1004b$'s potential VS are controlled in a manner as described below.

The silicon substrate 1001's potential $V_{sub}$ is set at, for example, the external power supply potential $V_{CC}$. The potential $V_W$ of the p-type well $1002a$ containing blocks to be erased is set at, for example, the external power supply potential $V_{CC}$. The control gates 1006's potentials $V_{G1-Gn}$ for all memory cells in the p-type well $1002a$ are set at the ground potential $V_{SS}$. The potential $V_S$ of the sources $1004a$ of the block $1003_{-1}$ containing memory cells to be erased is set at a high voltage $V_{PP}$. The high potential $V_{PP}$ is obtained by generating form the external power supply potential $V_{CC}$ with an internal high voltage generator circuit formed on the substrate 1001. The potential $V_{SO}$ of the sources $1004b$ of the block $1003_{-2}$ containing memory cells not to be erased is set at, for example, the external power supply potential $V_{CC}$. The potential $V_W$ of the p-type well $1002b$ containing only blocks not to be erased is set at, for example, the ground potential $V_{SS}$. This prevents the p-type well $1002b$ from being affected by the p-type well $1002a$ in which other blocks $1003_{-1}$ and $1003_{-2}$ contain memory cells to be erased, assuring a stable operation of the memory.

In the write mode, the potentials of the silicon substrate 1001 and p-type wells $1002a$, $1002b$, ... are set at the ground potential $V_{SS}$, while the drains 1005 and control gates 1006 of memory cells into which the information is to be written are set at a high voltage $V_{PP}$.

With the embodiment described above, the generation of substrate current due to band-to-band tunneling is suppressed, allowing operation with a 5 V external power supply only. This makes it possible to provide a nonvolatile memory device that is very easy to use. Forming one or more memory-cell blocks or all memory cell blocks in one well minimizes the chip size.

Figure 13:
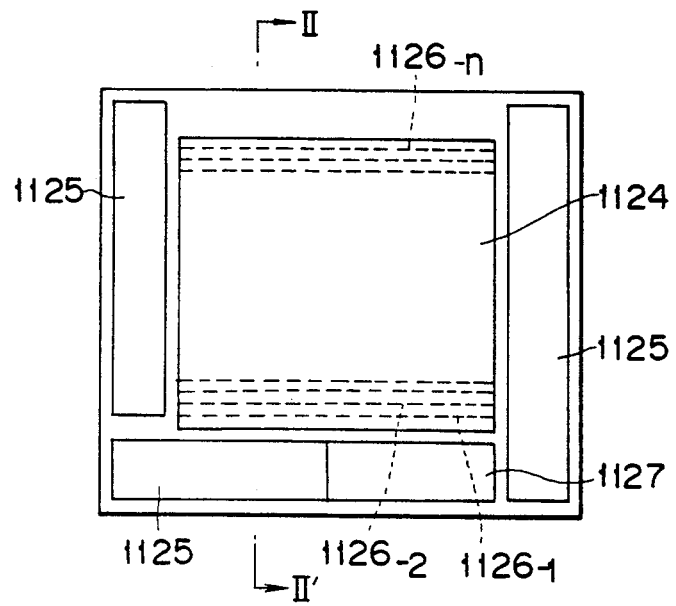
FIG. 13 is a plan view of a 16M-bit nonvolatile memory device as a further embodiment of the present invention.
Figure 14:
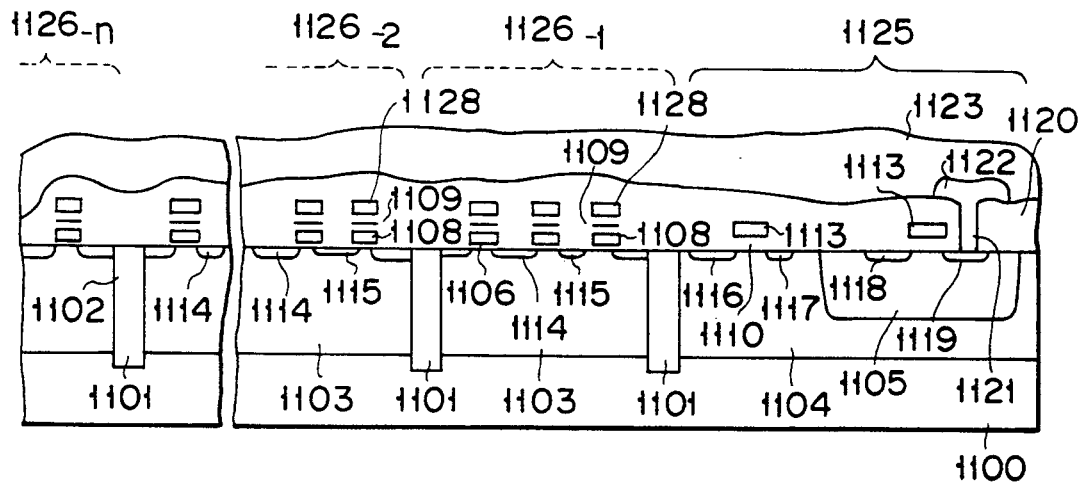
FIG. 14 is a sectional view taken on line II—II' in FIG. 13.

FIGS. 13 and 14 show a nonvolatile semiconductor memory device as a still further embodiment of the present invention. FIG. 13 is a schematic plan view of the entire chip of a nonvolatile memory device and FIG. 14 is a sectional view taken on line II—II' in FIG. 13. Numeral 1124 is a memory cell array, 1125 a control circuit, $1126_{-1}$ through $1126_{-n}$ blocks, and 1127 a high voltage generator circuit.

In an n-type silicon substrate 1100, a plurality of p-type wells 1103 for the memory cell region and a p-type well 1104 for the peripheral circuit region are formed. The p-type wells 1103 are separated from each other by isolating grooves 1101. The p-type well 1104 is separated from the p-type wells 1103 by the isolating grooves 1101. Each p-type well 1103 in the memory cell region includes one of the memory cell blocks $1126_{-1}$ through $1126_{-n}$, whereas it may include two or more memory cell blocks or all blocks $1126_{-1}$ through $1126_{-n}$. In the p-type well 1104 in the peripheral circuit region, a control circuit 1125 and high voltage generator circuit 1127 are formed, each of which is composed of a transistor mainly made up of a gate 1113, a source 1116 or 1118, and a drain 1117 or 1119.

In this nonvolatile memory device, the memory cell array 1124 is composed of 4096×4096 memory cells. If two rows of memory cells (8192 bits) sharing a source are grouped into one block, then all memory cells can be divided into blocks $1126_{-1}$ through $1126_{-2048}$.

To erase the stored information in blocks from the memory cells, the potentials applied to the n-type silicon substrate 1100, p-type well 1103, control gate 1128, and source 1114 are controlled by the control circuit 1125 in a way described below.

The silicon substrate 1100 is set at, for example, the external power supply voltage $V_{CC}$ (e.g., 5 V). A p-type well that contains a block including memory cells to be erased is set at, for example, the external power supply voltage $V_{CC}$, while a p-type well 1103 that contains a block including memory cells not to be erased is set at, for example, the ground potential $V_{SS}$. The control gates 1128 of all memory cells are set at, for example, the ground potential $V_{SS}$. The source 1114 of the block in the p-type well 1103 set at the external power supply voltage $V_{CC}$ is set at a high voltage $V_{PP}$. The high voltage $V_{PP}$ is obtained by generating from the external power supply voltage $V_{CC}$ with the high voltage generator circuit 1127 formed on the same substrate, making the chip appear to operate only on a 5-V power supply potential when viewed from the outside.

In the write mode, the silicon substrate 1100 and p-type well 1103 are set at, for example, the ground potential $V_{SS}$. The drain 1115 and control gate 1128 of a memory cell into which the information is written are set at a high voltage $V_{PP}$.

Since the potential of the p-type well 1104 in the peripheral circuit 1125 is always kept at the ground potential $V_{SS}$, this ensures a stable operation in any of the write, erase, and read modes.

With this arrangement, erasure of information from the memory cells applies no high voltage across the source 1114 of the memory cell to be erased and the p-type well 1103 containing the block including the memory cell to be erased. This allows a reduction in the substrate current due to band-to-band tunneling, making it possible to operate with a 5 V external power supply only. In the memory section, each p-type well 1103 electrically separated from each other by grooves 1101 contains one block only. This makes it possible to set the potential of the p-type well 1103 containing a block including memory cells not to be erased, independent of the potential of the p-type well 1103 containing a block including memory cells to be erased. This independent potential setting assures stable operation. The separation of p-type wells 1103 by grooves 1101 minimizes the chip size even when there are a lot of blocks.

Figure 15A:
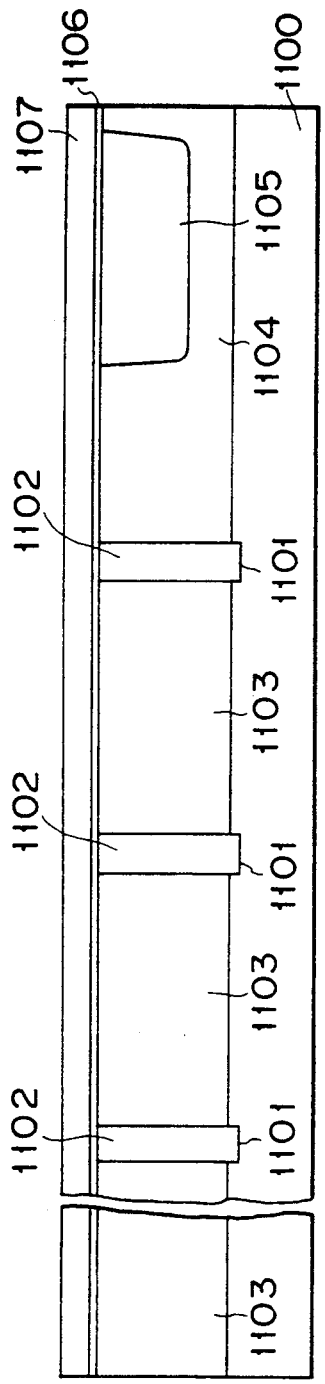
FIGS. 15A through 15C are sectional views showing the method of manufacturing the nonvolatile memory device of FIG. 14.
Figure 15B:
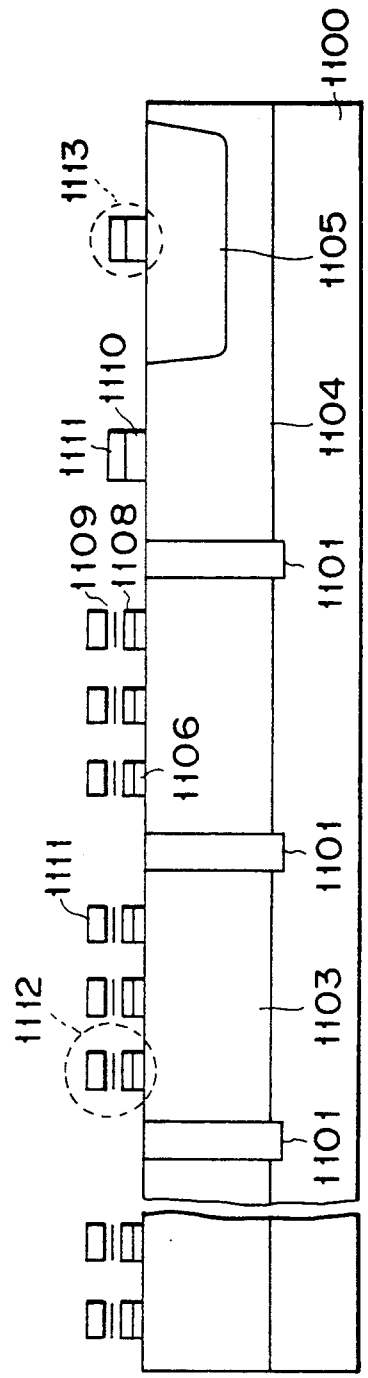
Figure 15C:
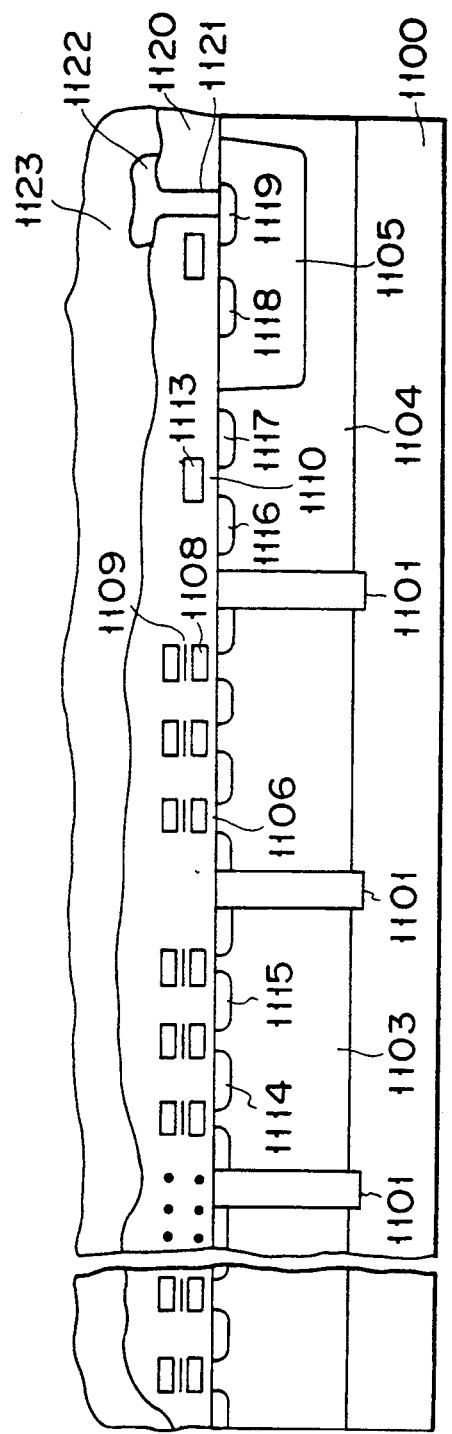

FIGS. 15A through 15C illustrate a manufacturing method for the nonvolatile memory device of FIG. 14.

As shown in FIG. 15A, patterning is performed on an n-type silicon substrate 1100 using a known photolithography technique to form isolating grooves 1101. In each groove 1101, polysilicon 1102 deposited by the chemical vapor growth method is embedded. After this, p-type impurity is ion-implanted in the substrate 1100 to form a plurality of p-type wells 1103 for the memory cell region and a p-type well 1104 for the peripheral circuit region. In the p-type well 1104 in the peripheral circuit region, an n-type well 1105 is formed. Over the entire surface, a first silicon oxide film 1106 is grown to a thickness of approximately 100 Å. Then, a first polysilicon layer 1107 is deposited, which in turn undergoes the patterning by means of a known photolithography technique as shown in FIG. 15B. As a result, the first silicon oxide film 1106 and first polysilicon layer 1107 remain in the region which is to be a floating gate. On the first polysilicon layer 1107, a composite film 1109 of a silicon oxide film and silicon nitride film is formed as an interlayer insulating film. After the composite film 1109 formed in the peripheral circuit region is removed, a second silicon oxide film 1110 is grown to form a gate insulating film for the transistors in the peripheral circuit. Over the surface, a second polysilicon layer 1111 is deposited. After this, the patterning of the memory section is achieved using a known photolithograph technique to form a two-layer gate structure in a self-aligning manner. In the peripheral circuit region, patterning is done on the second polysilicon 1111 to form transistor's gates 1113. Then, as shown in 15C, an $n^+$-type region that is to be a source 1114 and drain 1115 is formed by ion-implanting arsenic (As), for example. To improve the junction breakdown voltage of the source 1114, phosphorus (P) is ion-implanted in the source 1114 only. In the peripheral circuit region, the source 1116 and drain 1117 of an n-channel transistor is formed by ion-implantation of arsenic, while the source 1118 and drain 1119 of a p-channel transistor is formed by ion-implanting boron (B). After this, the oxidization, the deposition of passivation film 1120, the opening of contact hole 1121, the formation of aluminum interconnections (1122), and the deposition of protecting film 1123 are performed to complete the semiconductor memory device.

Figure 16:
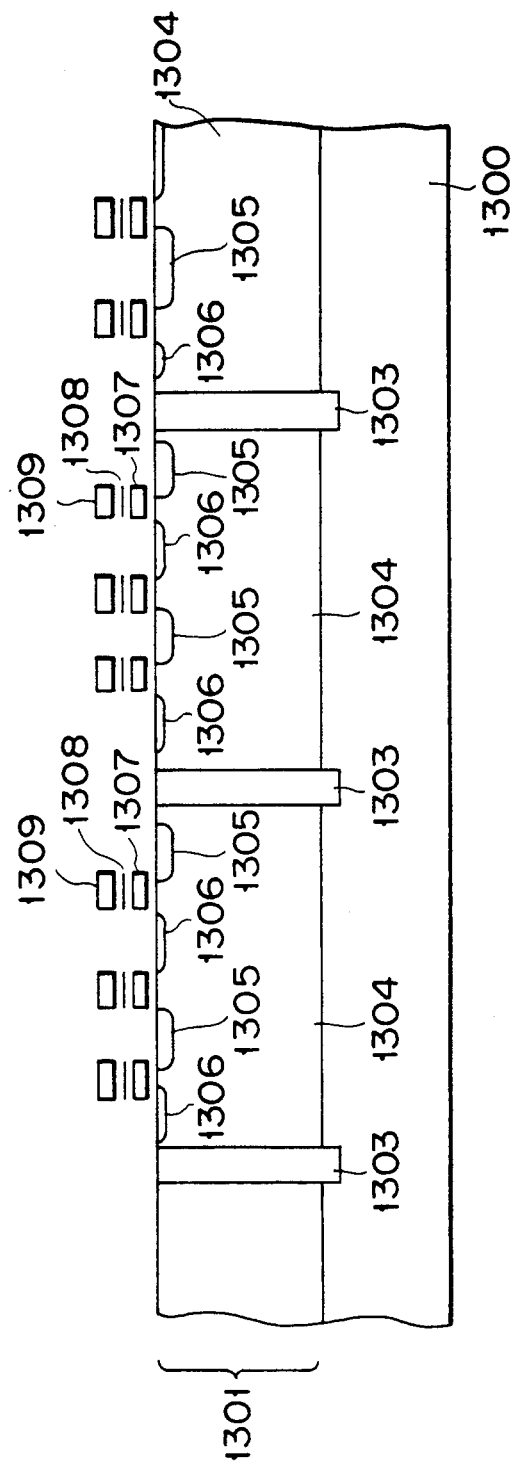

While in the embodiment shown in FIGS. 13 and 14, the p-type well 1103 is formed by injecting ions into the n-type silicon substrate 1100, the similar result may be obtained by growing a p-type epitaxial layer 1301 on the n-type silicon substrate 1300 and separating the p-type wells 1304 with grooves 1303 as shown in FIG. 16. Numeral 1304 indicates a common source, 1306 a drain, 1307 a floating gate, 1308 a composite film, and 1309 a control gate.

FIGS. 17 through 20 show nonvolatile semiconductor memory devices related to still other embodiments of the present invention.

The embodiment of FIG. 17 is a modification of that in FIG. 14, wherein the memory cells are the same as those in FIG. 9. Numeral 1400 indicates an n-type silicon substrate, 1401 element isolating grooves, 1402 polysilicon, 1403 p-type wells for the memory cell region, 1404 a p-type well for the peripheral circuit region, 1405 an n-type well, 1406 a thin oxide film, 1407 a floating gate, 1408 a composite film, 1409 a control gate, 1410 and 1411 silicon oxide films, and 1412 a select gate.

The embodiment in FIG. 18 is a modification of that in FIG. 14, wherein the memory cells are the same as those in FIG. 10. Numeral 1500 indicates an n-type silicon substrate, 1501 element isolating grooves, 1502 polysilicon, 1503 p-type wells for the memory cell region, 1504 a p-type well for the peripheral circuit region, 1505 an n-type well, 1506 a thin oxide film, 1507 a floating gate, 1508 a composite film, 1509 a control gate, 1510 a channel region, 1511 a gate in the peripheral circuit region, 1512 the drain of a memory cell, 1513 and 1514 the source or drain of a transistor in the peripheral circuit and 1515 the source of the memory cell.

Figure 19:
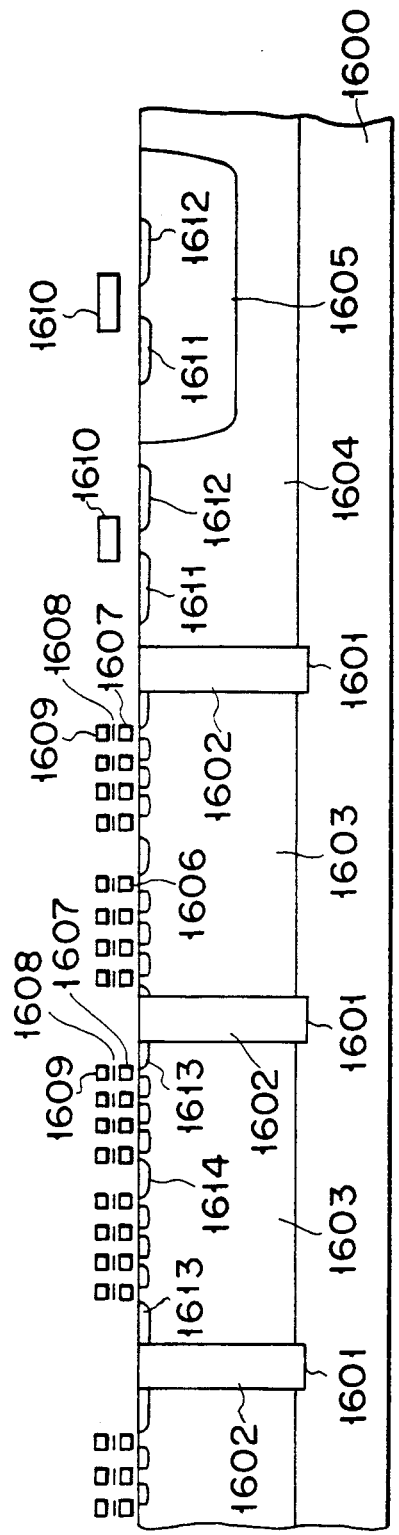

The embodiment of FIG. 19 is a modification of that in FIG. 14, wherein the memory cells are the same as those of FIG. 11. Numeral 1600 indicates an n-type silicon substrate, 1601 element isolating grooves, 1602 polysilicon, 1603 p-type wells for the memory cell region, 1604 a p-type well for the peripheral circuit region, 1605 an n-type well, 1606 a thin oxide film, 1607 a floating gate, 1608 a composite film 1609 a control gate, 1610 a gate in the peripheral circuit region, 1611 and 1612 the source or drain of a transistor in the peripheral circuit, 1613 the source of the memory cell, and 1614 the drain of the memory cell.

Figure 20:
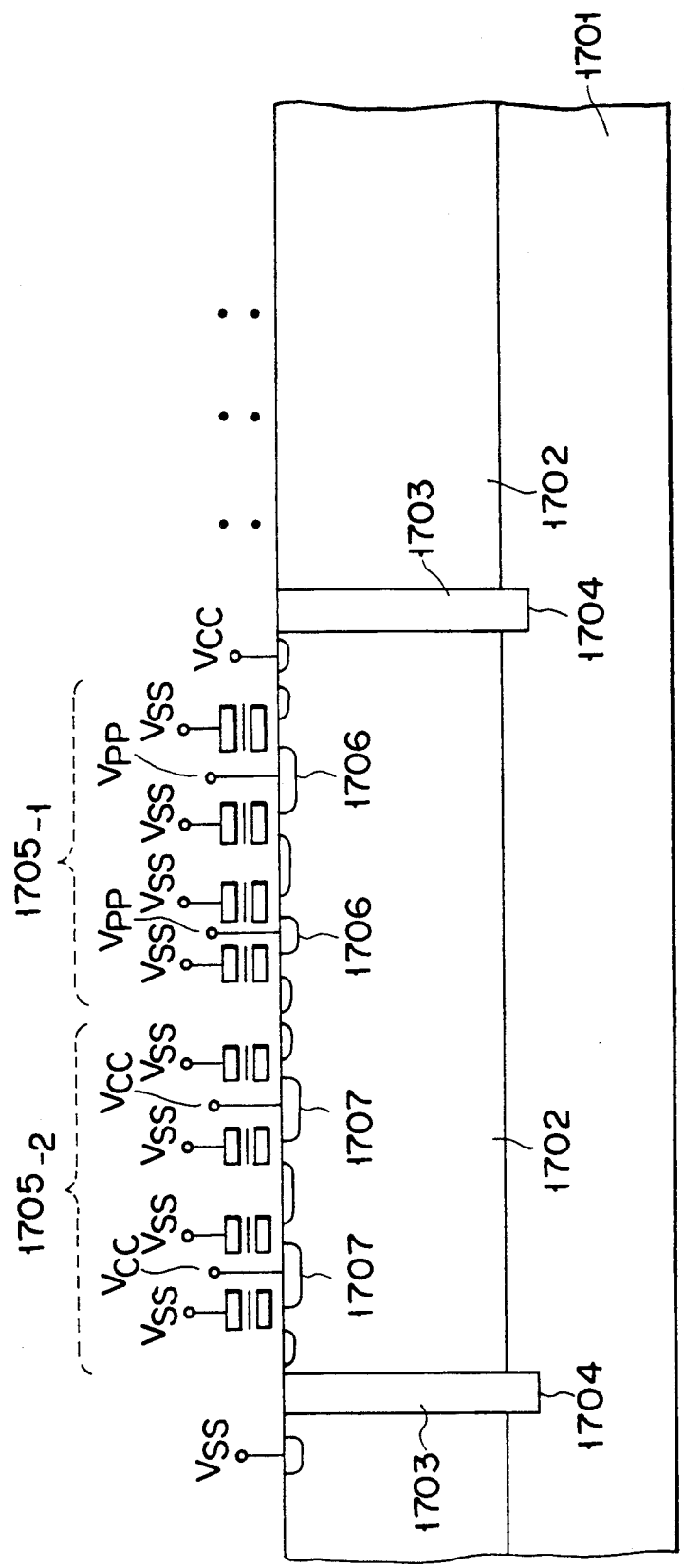

In the embodiment of FIG. 20, memory cells are formed in a p-type well 1702 formed in an n-type silicon substrate 1701. Multiple memory cell blocks $1705_{-1}$ and $1705_{-2}$ are formed in one p-type well 1702. Each p-type well 1702 is electrically separated from each other by grooves 1304 formed in the surface of the silicon substrate 1701. In each groove 1704, polysilicon 1703 deposited by the chemical vapor growth method is embedded.

To erase the information from the memory cells, the silicon substrate 1701 and p-type well 1702 are set at, for example, the external power supply potential $V_{CC}$, while the control gate of every memory cell is set at, for example, the ground potential $V_{SS}$. The sources 1706 of the memory cells in the block $1705_{-1}$ containing memory cells to be erased are set at a high voltage $V_{PP}$ generated by the internal high voltage generator circuit, while the sources 1706 of the memory cells in the block $1705_{-2}$ containing memory cells not to be erased are set at, for example, the external power supply voltage $V_{CC}$. Since the high voltage $V_{PP}$ is obtained by raising the external power supply potential $V_{CC}$ with the high voltage generator circuit formed on the same substrate, this enables the memory to operate from a 5-V external power supply only. In addition, the p-type well 1702 only containing blocks including memory cells not to be erased is set at, for example, the ground potential $V_{SS}$, preventing it from being affected by other p-type wells 1702.

In the write mode, the silicon substrate 1701 and p-type well 1702 are set at, for example, the ground potential $V_{SS}$, while the drain and control gate of a memory cell into which the information is written are set at a high voltage $V_{PP}$.

While in the embodiments so far described, n-channel memory cells are used, p-channel memory cells may be used.

The preferred embodiments described herein are therefore illustrative and not restrictive, the scope of the invention being indicated by the appended claims and all variations which come within the meaning of the claims are intended to be embraced therein.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array formed in a substrate and including a collection of blocks, each block containing a plurality of memory cells sharing a common terminal, the common terminal being one of a source and a drain;
   a first region having a surface region, said plurality of memory cells being formed in said surface region; and
   a control circuit that, in an erase mode, sets the common terminal of the plurality of memory cells in a block to be erased at a first potential and sets said first region at a second potential higher than a GND potential and lower than said first potential, and at the same time, sets the common terminal of the plurality of memory cells in a block not to be erased at a third potential equal to or higher than said second potential and lower than said first potential.

2. The nonvolatile semiconductor memory device according to claim 1, wherein said control circuit sets the common terminal of the plurality of memory cells in the clock to be erased at a potential generated by a high voltage generator circuit formed in the substrate.

3. The nonvolatile semiconductor memory device according to claim 1, wherein said control circuit sets said first region at the second potential, the second potential being a power supply potential applied from outside of the substrate.

4. The nonvolatile semiconductor memory device according to claim 1, wherein said control circuit sets the common terminal of the plurality of memory cells in a block not to be erased at a power supply potential supplied from outside of the substrate.

5. The nonvolatile semiconductor memory device according to claim 1, wherein said first region is a well formed in said substrate.

6. The nonvolatile semiconductor memory device according to claim 1, wherein said first region includes an epitaxial layer formed on said substrate and separated into a plurality of wells by grooves, each well corresponding to a block of the collection of blocks.

7. The nonvolatile semiconductor memory device according to claim 1, wherein each memory cell of said plurality of memory cells includes a first insulating film formed on said substrate, a floating gate formed on said first insulating film, a second insulating film formed on said floating gate, and a control gate formed on said second insulating film.

8. The nonvolatile semiconductor memory device according to claim 1, wherein each memory cell of said plurality of memory cells includes a first insulating film formed on said substrate, a floating gate formed on said first insulating film, a second insulating film formed on said floating gate, a control gate formed on said second insulating film, and a select gate separated from side walls of said floating gate and said control gate with a third insulating film and separated from said substrate with a fourth insulating film.

9. The nonvolatile semiconductor memory device according to claim 1, wherein each memory cell of said plurality of memory cells includes a first insulating film formed on said substrate, a floating gate formed on said first insulating film to cover a portion of a channel region, a second insulating film formed on said floating gate, and a control gate formed over a remaining portion of said first insulating film over said channel region not covered with said floating gate, said control gate also being formed on said second insulating film to cover said floating gate.

10. The nonvolatile semiconductor memory device according to claim 1, wherein each memory cell of said plurality of memory cells includes a plurality of memory elements, each memory element of said plurality of memory elements including a first insulating film formed on said substrate, a floating gate formed on said first insulating film, a second insulating film formed on said floating gate, and a control gate formed on said second insulating film, each memory element of said plurality of memory elements being connected in series.

11. A nonvolatile semiconductor memory device comprising:
    a memory cell array formed in a substrate and including a collection of blocks, each block containing a plurality of memory cells sharing a common terminal, the common terminal being one of a source and a drain;
    a first region having a surface region in which one or more blocks of said collection of blocks are formed; and
    a control circuit that, in an erase mode, sets the common terminal of the plurality of memory cells in a block to be erased at a first potential and sets said first region at a second potential higher than a GND potential and lower than said first potential, and at the same time, sets the common terminal of the plurality of memory cells in a block not to be erased at a third potential equal to or higher than said second potential and lower than said first potential.

12. The nonvolatile semiconductor memory device according to claim 11, wherein said control circuit sets the common terminal of the plurality of memory cells in a block to be erased at a potential generated by a high voltage generator circuit formed in the substrate.

13. The nonvolatile semiconductor memory device according to claim 11, wherein said control circuit sets said first region at the second potential, the second potential being a power supply potential applied from outside of the substrate.

14. The nonvolatile semiconductor memory device according to claim 11, wherein said control circuit sets the common terminal of the plurality of memory cells in a block not to be erased at a power supply potential supplied from outside of the substrate.

15. The nonvolatile semiconductor memory device according to claim 11, wherein said first region is a well formed in said substrate.

16. The nonvolatile semiconductor memory device according to claim 11, wherein said first region includes an epitaxial layer formed on said substrate and separated into a plurality of wells by grooves, each well corresponding to a block of the collection of blocks.

17. The nonvolatile semiconductor memory device according to claim 11, wherein each memory cell of said plurality of memory cells includes a first insulating film formed on said substrate, a floating gate formed on said first insulating film, a second insulating film formed on said floating gate, and a control gate formed on said second insulating film.

18. The nonvolatile semiconductor memory device according to claim 11, wherein each memory cell of said plurality of memory cells includes a first insulating film formed on said substrate, a floating gate formed on said first insulating film, a second insulating film formed on said floating gate, a control gate formed on said second insulating film, and a select gate separated from side walls of said floating gate and said control gate with a third insulating film and separated from said substrate with a fourth insulating film.

19. The nonvolatile semiconductor memory device according to claim 11, wherein each memory cell of said plurality of memory cells includes a first insulating film formed on said substrate, a floating gate formed on said first insulating film to cover a portion of a channel region, a second insulating film formed on said floating gate, and a control gate formed over a remaining portion of said first insulating film over said channel region not covered with said floating gate, said control gate also being formed ons aid second insulating film to cover said floating gate.

20. The nonvolatile semiconductor memory device according to claim 11, wherein each memory cell of said plurality of memory cells includes a plurality of memory elements, each memory element of said plurality of memory elements including a first insulating film formed on said substrate, a floating gate formed on said first insulating film, a second insulating film formed on said floating gate, and a control gate formed ons aid second insulating film, each memory element of said plurality of memory elements being connected in series.

* * * * *